(12) United States Patent
Li et al.

(10) Patent No.: US 10,091,540 B2
(45) Date of Patent: *Oct. 2, 2018

(54) TECHNIQUES FOR TRANSMITTING VIDEO CONTENT TO A WIRELESSLY DOCKED DEVICE HAVING A DISPLAY

(71) Applicant: INTEL CORPORATION, Santa Clara, CA (US)

(72) Inventors: Guoqing Li, Portland, OR (US); Jeffrey R. Foerster, Portland, OR (US); Yaniv Frishman, Kiryat Ono (IL)

(73) Assignee: INTEL CORPORATION, Santa Clara, CA (US)

(*) Notice: Subject to any disclaimer, the term of this patent is extended or adjusted under 35 U.S.C. 154(b) by 238 days.

This patent is subject to a terminal disclaimer.

(21) Appl. No.: 15/070,550

(22) Filed: Mar. 15, 2016

(65) Prior Publication Data

US 2016/0309208 A1 Oct. 20, 2016

Related U.S. Application Data

(63) Continuation of application No. 14/624,344, filed on Feb. 17, 2015, now Pat. No. 9,325,452, which is a (Continued)

(51) Int. Cl.
*H04N 21/24* (2011.01)
*H04N 21/4363* (2011.01)
(Continued)

(52) U.S. Cl.
CPC ....... *H04N 21/2404* (2013.01); *G06F 3/1462* (2013.01); *G06F 11/1004* (2013.01);
(Continued)

(58) Field of Classification Search
CPC .... G06F 3/1462; G06F 11/1004; G06F 11/07; G06F 11/30; G06F 11/08; H04N 21/2404; H04N 21/4122; H04N 19/176; H04N 21/23418; H04N 21/4367; H03M 13/09; H03M 13/096
See application file for complete search history.

(56) References Cited

U.S. PATENT DOCUMENTS

2003/0030618 A1* 2/2003 Jones ................... G09G 3/3611
345/102
2013/0268621 A1* 10/2013 Mese ................... H04N 19/176
709/217

* cited by examiner

*Primary Examiner* — Shelly A Chase

(57) ABSTRACT

Examples are disclosed for transmitting video content. In some examples, cyclic redundancy check (CRC) values may be added to video content for video frames to be presented or displayed in a given region of a display. Results of CRC functions for consecutive video frames that use the added CRC values may be compared to determine whether the video content for the consecutive video frames is static video content. Video content for at least one of the consecutive video frames may be withheld from being transmitted if the video content for the consecutive video frames is characterized as static video content. Multiple CRC values or different CRC values may be added to further determine whether video content for the consecutive video frames or for subsequent consecutive video frames is also characterized as static video content. Other examples are described and claimed.

30 Claims, 10 Drawing Sheets

Related U.S. Application Data continuation of application No. 13/797,861, filed on Mar. 12, 2013, now Pat. No. 8,977,945.

(51) Int. Cl.

| | | |
|---|---|---|
| *H04N 21/41* | (2011.01) | |
| *G09G 5/00* | (2006.01) | |
| *H04N 21/414* | (2011.01) | |
| *H04N 21/44* | (2011.01) | |
| *G06F 11/10* | (2006.01) | |
| *H03M 13/09* | (2006.01) | |
| *H04L 1/00* | (2006.01) | |
| *G06F 3/14* | (2006.01) | |
| *G06K 9/62* | (2006.01) | |
| *H04N 21/234* | (2011.01) | |
| *G06F 11/08* | (2006.01) | |
| *H04W 84/12* | (2009.01) | |

(52) U.S. Cl.
CPC ............ *G06K 9/6215* (2013.01); *G09G 5/00* (2013.01); *H03M 13/09* (2013.01); *H04L 1/0061* (2013.01); *H04N 21/23418* (2013.01); *H04N 21/4122* (2013.01); *H04N 21/41407* (2013.01); *H04N 21/43637* (2013.01); *H04N 21/44008* (2013.01); *G06F 11/08* (2013.01); *H04W 84/12* (2013.01)

700

- RECEIVE VIDEO CONTENT TO BE PRESENTED IN A FIRST REGION OF A DISPLAY FOR A DEVICE
  702

- ADD A CRC VALUE TO THE VIDEO CONTENT
  704

- COMPARE FIRST AND SECOND RESULTS OF A CRC FUNCTION EXECUTED FOR RESPECTIVE CONSECUTIVE FIRST AND SECOND VIDEO FRAMES FOR THE VIDEO CONTENT
  706

- CHARACTERIZE THE VIDEO CONTENT AS STATIC VIDEO CONTENT FOR THE FIRST AND SECOND VIDEO FRAMES BASED ON THE FIRST AND SECOND RESULTS MATCHING
  708

- DETERMINE WHETHER A CONSECUTIVE THIRD VIDEO FRAME FOR THE VIDEO CONTENT IS ALSO CHARACTERIZED AS STATIC VIDEO CONTENT
  - ADD A DIFFERENT CRC VALUE TO THE VIDEO CONTENT
    712
  - COMPARE THIRD AND FOURTH RESULTS OF THE CRC FUNCTION EXECUTED FOR RESPECTIVE SECOND AND THIRD VIDEO FRAMES FOR THE VIDEO CONTENT
    714
  - CHARACTERIZE THE VIDEO CONTENT FOR THE THIRD VIDEO FRAME AS STATIC VIDEO CONTENT BASED ON THE THIRD AND FOURTH RESULTS MATCHING
    716
  710

- RECEIVE VIDEO CONTENT TO BE PRESENTED IN A FIRST REGION OF A DISPLAY FOR A DEVICE
  802

- ADD A CRC VALUE TO THE VIDEO CONTENT
  804

- COMPARE FIRST AND SECOND RESULTS OF A CRC FUNCTION EXECUTED FOR RESPECTIVE CONSECUTIVE FIRST AND SECOND VIDEO FRAMES FOR THE VIDEO CONTENT
  806

- CHARACTERIZE THE VIDEO CONTENT AS STATIC VIDEO FOR THE FIRST AND SECOND VIDEO FRAMES BASED ON THE FIRST AND SECOND RESULTS MATCHING
  808

- CHARACTERIZE VIDEO CONTENT FOR CONSECUTIVE VIDEO FRAMES FOLLOWING THE FIRST VIDEO FRAME BASED ON
  - MAINTAINING A COUNT OF CONSECUTIVE VIDEO FRAMES FOR THE VIDEO CONTENT CHARACTERIZED AS STATIC VIDEO CONTENT
    812
  - COMPARING THE COUNT TO A THRESHOLD COUNT VALUE
    814
  - ADDING A SECOND CRC VALUE TO THE VIDEO CONTENT BASED ON THE COUNT EXCEEDING THE THRESHOLD VALUE
    816
  - COMPARING THIRD AND FOURTH RESULTS OF THE CRC FUNCTION EXECUTED FOR RESPECTIVE FIRST AND SECOND SUBSEQUENT VIDEO FRAMES FOR THE VIDEO CONTENT FOLLOWING THE COUNT EXCEEDING THE THRESHOLD COUNT VALUE
    818
  - CHARACTERIZE THE VIDEO CONTENT FOR THE FIRST AND SECOND SUBSEQUENT VIDEO FRAMES AS STATIC VIDEO CONTENT BASED ON THE THIRD AND FOURTH RESULTS MATCHING
    820
  810

*FIG. 8*

TECHNIQUES FOR TRANSMITTING VIDEO CONTENT TO A WIRELESSLY DOCKED DEVICE HAVING A DISPLAY

CROSS REFERENCE TO RELATED APPLICATIONS

This application is a continuation of, claims the benefit of and priority to previously filed U.S. patent application Ser. No. 14/624,344, entitled "Techniques for Transmitting Video Content to a Wirelessly Docked Device Having a Display" filed Feb. 17, 2015, which is a continuation of U.S. patent application Ser. No. 13/797,861, filed Mar. 12, 2013, of the same title, issued as U.S. Pat. No. 8,977,945 on Mar. 10, 2015; the subject matter of all of the above are incorporated herein by reference in their entirety.

TECHNICAL FIELD

Examples described herein are generally related to a device wirelessly transmitting video content to a device having a display.

BACKGROUND

Computing devices having wireless capabilities may communicatively couple to other devices having wireless capabilities via a wireless local area network (WLAN) using wireless technologies such as Wi-Fi™. Also, wireless technologies designed to operate in a 60 GHz communication band such as WiGig™ may allow wireless capable devices to replace wired interconnects with high speed and relatively short range wireless interconnects via a process typically referred to as wireless docking. The high speed and relatively short range wireless interconnects using wireless technologies such as WiGig may allow devices to wirelessly dock with other devices having displays. In some examples, once wirelessly docked, the device may utilize another device's display in a same manner as displays may be used when connected to a wired or physical docking station.

BRIEF DESCRIPTION OF THE DRAWINGS

FIG. 7 illustrates an example of a second logic flow.
FIG. 8 illustrates an example of a third logic flow.

DETAILED DESCRIPTION

Figure 1:
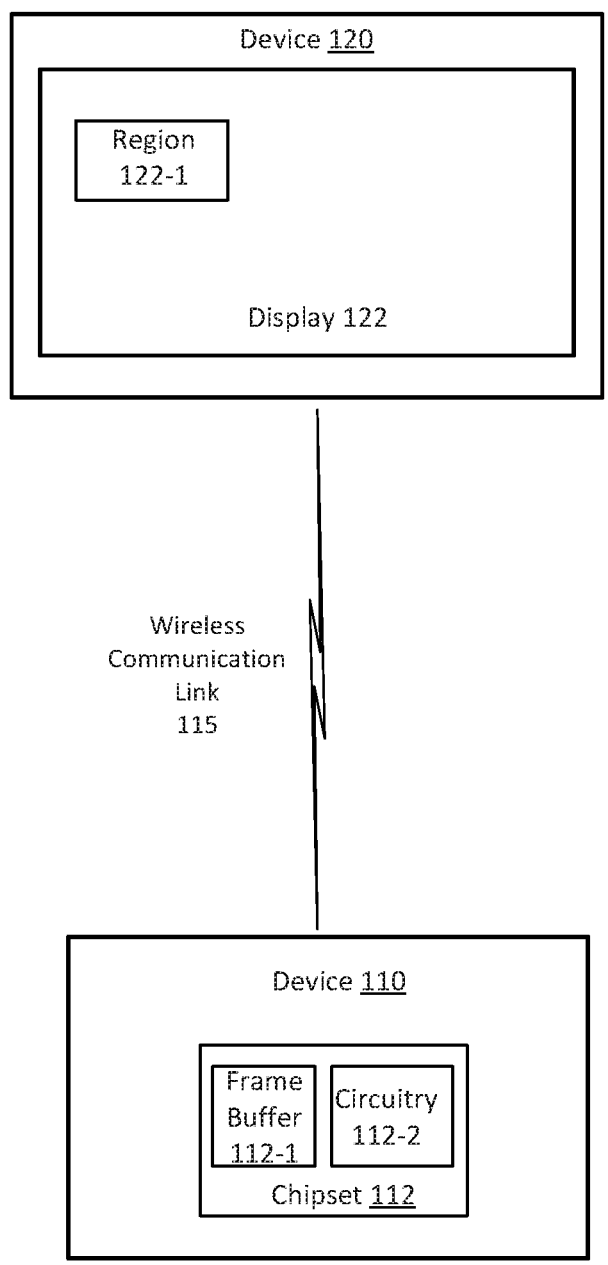
FIG. 1 illustrates an example of a system.

Examples are generally directed to improvements for devices to wirelessly couple or wirelessly dock using wireless technologies associated with Wi-Fi or WiGig. These wireless technologies may include wireless technologies suitable for use with devices or user equipment (UE) or access points deployed in or coupled via a WLAN. For example, wirelessly capable devices or access points for a WLAN may be configured to operate in compliance with various WLAN standards promulgated by the Institute of Electrical and Electronic Engineers (IEEE). These WLAN standards may include Ethernet wireless standards (including progenies and variants) associated with the IEEE Standard for Information technology—Telecommunications and information exchange between systems—Local and metropolitan area networks—Specific requirements Part 11: WLAN Media Access Controller (MAC) and Physical Layer (PHY) Specifications, published March 2012, and/or later versions of this standard ("IEEE 802.11").

In some examples various IEEE standards associated with IEEE 802.11 such as IEEE 802.11a/g, IEEE 802.11ac or IEEE 802.11ad may be utilized by wirelessly capable devices or access points to establish or maintain communication links within a WLAN and/or establish wireless communications with each other (e.g., wireless docking). According to some examples, devices capable of operating in compliance with IEEE 802.11ad and/or using wireless technologies associated with WiGig may include components such as chipsets capable of supporting a WiGig Display Extension (WDE). Using WDE, for example, a device may be able to wirelessly couple or dock to other devices having displays. These other devices having displays may also be capable of supporting WDE and may include, but are not limited to, a monitor, a television, a smartphone, a notebook computer, a tablet computer, an ultrabook computer, a netbook computer, desktop computer with integrated monitor, a handheld gaming device, a gaming console with integrated display, a handheld media player or media player with integrated display.

According to some examples, one characteristic of wireless docking may be that video content to be displayed or presented may be static for relatively long periods of time. The static characteristic may be due to use of various office productivity applications such word processing applications (e.g., Microsoft® Word®), presentation applications (e.g., Microsoft PowerPoint®), graphic applications, web browsers, etc. In some examples, at least portions or regions of a display may continue to remain static even if other portions periodically change. For example, when editing or creating a word processing document only a region of a display where text is being added or modified changes. Other regions outside of the edited text portions (e.g., tool bar or borders) may remain static. Power saving opportunities may be presented by withholding transmission of video content for video frames associated with those static regions that may be characterized as static video content.

Some methods being considered for detecting and characterizing video content as static video content first attempt to identify a region of a display that may be characterized as presenting static video content. One method utilizes a cyclic redundancy check (CRC) function for portions or regions of a display. For example, a given number of horizontal or vertical lines may be associated with a given region of the display. A CRC value may be assigned or added to video content destined to be presented in the given region. The video content to be presented in the given region may be included in video frames at a given rate of up to several dozen frames per second (e.g., 24, 30, 60 or higher). The basic idea of this method is to compare results of CRC functions for two consecutive video frames of the video content. The results of the CRC functions may include multiplying the assigned CRC value by separate values representing the video content destined for display or presentation in the given region for respective consecutive video frames. Hence, if the video content does not change between frames, the results of the CRC functions will match. Matching results may indicate that the video content for these consecutive video frames is static video content (e.g., unchanged between video frames). If the results of the CRC function don't match, the video content may be characterized as non-static video content. Data associated with static video content for the given region does not need to be refreshed and thus may be withheld or not transmitted with the second of the two consecutive video frames.

As mentioned above, video content may be included in video frames provided for display at a rate of 60/sec. or higher. Also, video frames including video content to be transmitted for presentation in multiple regions of a display may result in thousands of comparisons being conducted between each consecutive video frame for video content to be presented in these multiple regions. Therefore, relatively simple CRC values that may be smaller than 8-bits in length are used when implementing the CRC function to generate comparison results. The simple CRC values and the large number of calculations may result in an unacceptably high probability of mischaracterization of video content as static video content (e.g., result collisions). As mentioned above, if the video content is characterized as static video content, the given region of the display for the video content is not refreshed. Eventually, the mischaracterized video content may become observable to the human eye as other regions of the display may have changed but the given region did not. It is with respect to these and other challenges that the examples described herein are needed.

According to some examples, video content may be received at a device. The video content may be presented in a first region of a display. For these examples, a CRC value may be added to or associated with the video content. A comparison of first and second results of a CRC function executed for respective consecutive first and second video frames for the video content may then be made. The video content may then be characterized as static video content for the first and second video frames based on the first and second results matching. In some examples, a determination as to whether a consecutive third video frame for the video content is also characterized as static video content may be made. The determination may include adding a different CRC value to the video content, comparing third and fourth results of the CRC function executed for respective second and third video frames of the video content, and characterizing the video content for the third video frame as static video content based on the third and fourth results matching.

FIG. 1 illustrates an example system 100. In some examples, as shown in FIG. 1, system 100 includes a device 110 coupled to device 120 via a wireless communication link 115. Also as shown in FIG. 1, device 120 includes a display 122 having a region 122-1. As described more below, logic and/or features located at or with device 110 may be capable of wirelessly docking to device 120 to display video content. In some examples, the video content may be destined for a region on display 122 to include region 122-1.

In some examples, device 110 and display 122 may be arranged to operate according to the one or more wireless network technologies associated with IEEE 802.11 such as IEEE 802.11ad and/or associated with WiGig. For these examples, device 110 may attempt to establish a wireless dock with device 120 via wireless communication link 115. Logic and/or features of device 110 or device 120 having display 122 may be capable of supporting a WiGig Display Extension (WDE). For example, use of WDE may enable video content to be transmitted from device 110 to device 120 for display in region 122-1 of display 122 through the wireless dock established via wireless communication link 115.

According to some examples, the logic and/or features located at or with device 110 may include a chipset 112 having a frame buffer 112-1 and circuitry 112-2. As described more below, circuitry 112-2 may be capable of executing various modules to characterize video content that may be displayed at a wirelessly docked device having a display such as device 120. Also, frame buffer 112-1 may be capable of at least temporarily maintaining the video content to be characterized by the modules executed by circuitry 112-2. Frame buffer 112-1 may include one or more types of volatile memory or non-volatile memory to at least temporarily maintain the video content.

In some examples, although not shown in FIG. 1, device 110 may also include a display (integrated or external) or other peripheral components.

According to some examples, the video content destined for presentation or display in region 122-1 may be associated with various types of productivity applications including, but not limited to, word processing applications, presentation applications, graphic applications or web browsers. Other types of applications may include multimedia applications. Whether multimedia or productivity applications, both types may display a combination of text, graphics, pictures or video that may incorporate both static and non-static video content that may be presented in various regions of display 122.

According to some examples, a presentation application may cause an animated graphic (non-static video) to be displayed in one region of display 122 while having a somewhat static chart displayed in another region such as region 122-1. The animated graphic may point to or describe various aspects of the chart to be displayed in region 122-1. Modules to be executed by circuitry 112-2 of chipset 112 at device 110 may characterize the video content destined for region 122-1 as static video content and thus may withhold transmission of video content destined for region 122-1 for each video frame sent for presentation on display 122 while that static characterization remains. As mentioned above, that characterization may be based on a comparison of results of a CRC function executed for respective consecutive video frames for the video content destined for region 122-1.

In some examples, the chart may change to a different or modified chart. If video content destined for region 122-1 (e.g., the chart) was mischaracterized as static for subsequent data frames following this change, then the animated graphic may refer to a changed or a modified chart but the chart presented would be the previous unmodified chart. As described more below, logic and/or features located at or with device 110 may implement techniques to reduce the probability of a mischaracterization of video content destined for a given region of a display and also may attempt to reduce or mitigate possible issues caused by mischaracterization.

Figure 2:
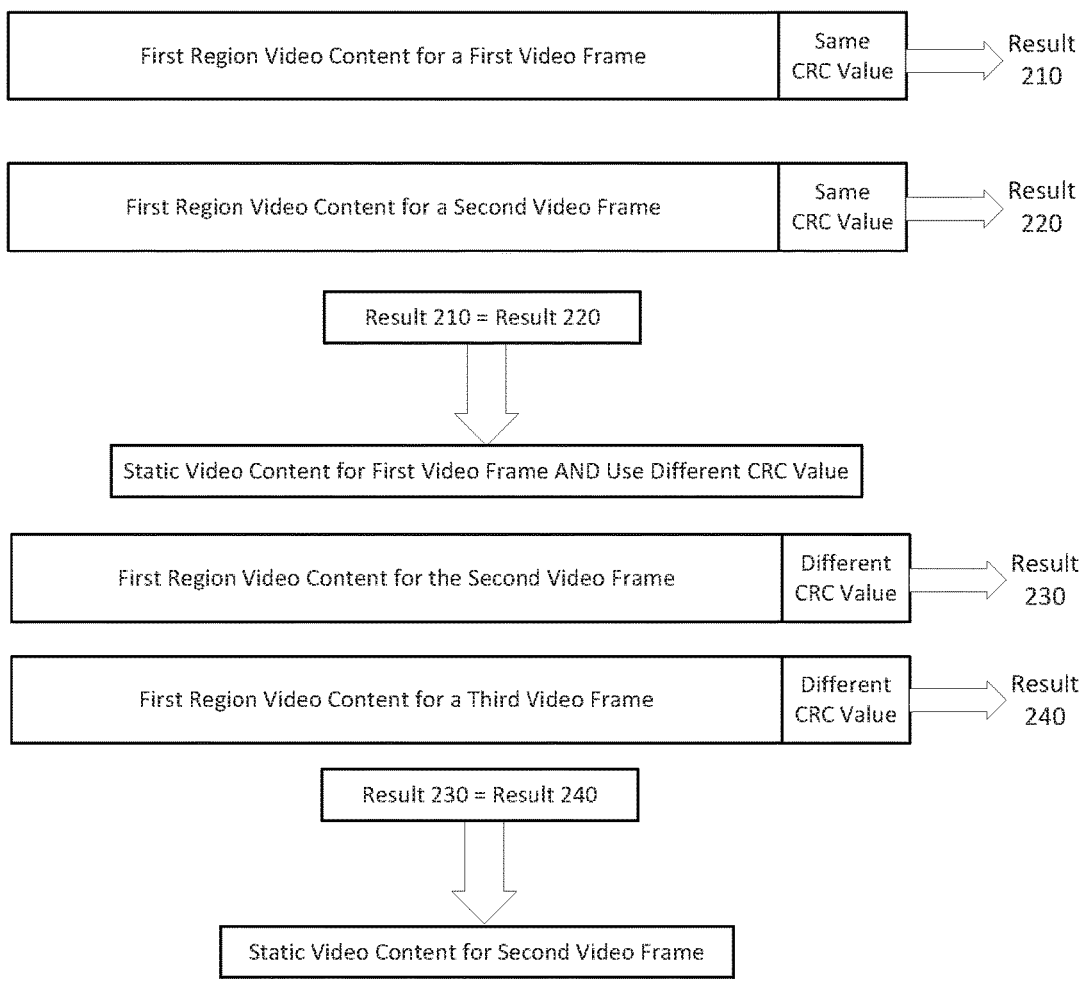
FIG. 2 illustrates an example first characterization scheme.
Figure 3:
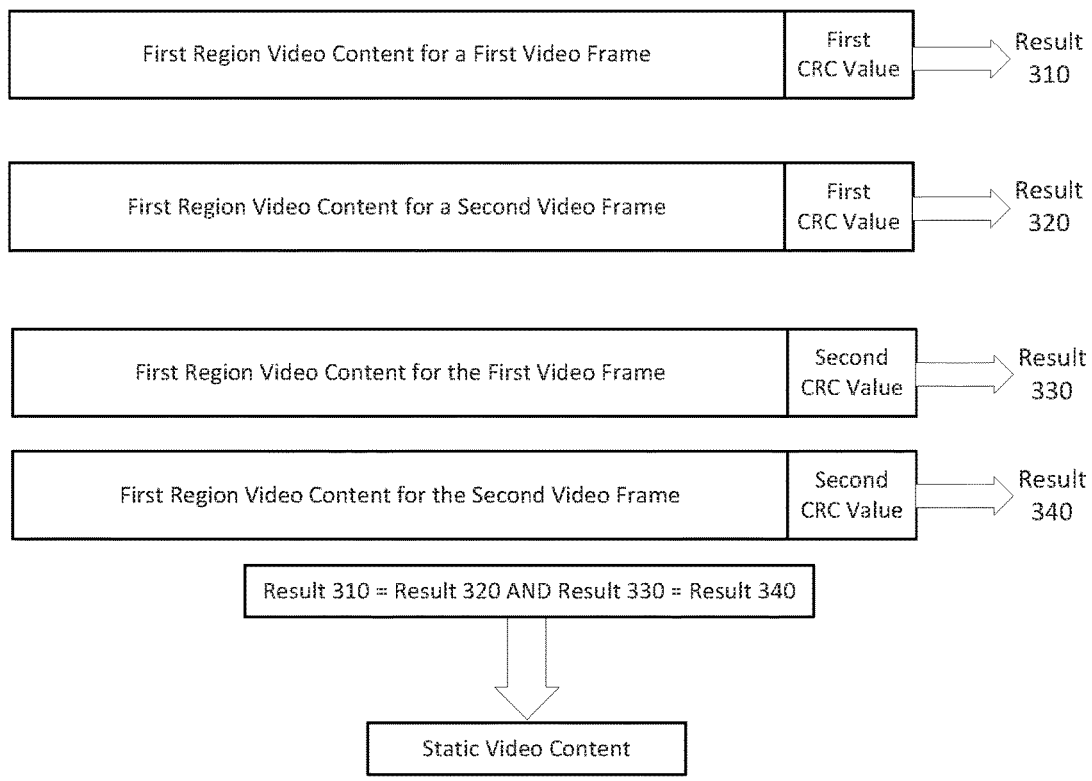
FIG. 3 illustrates an example second characterization scheme.
Figure 4:
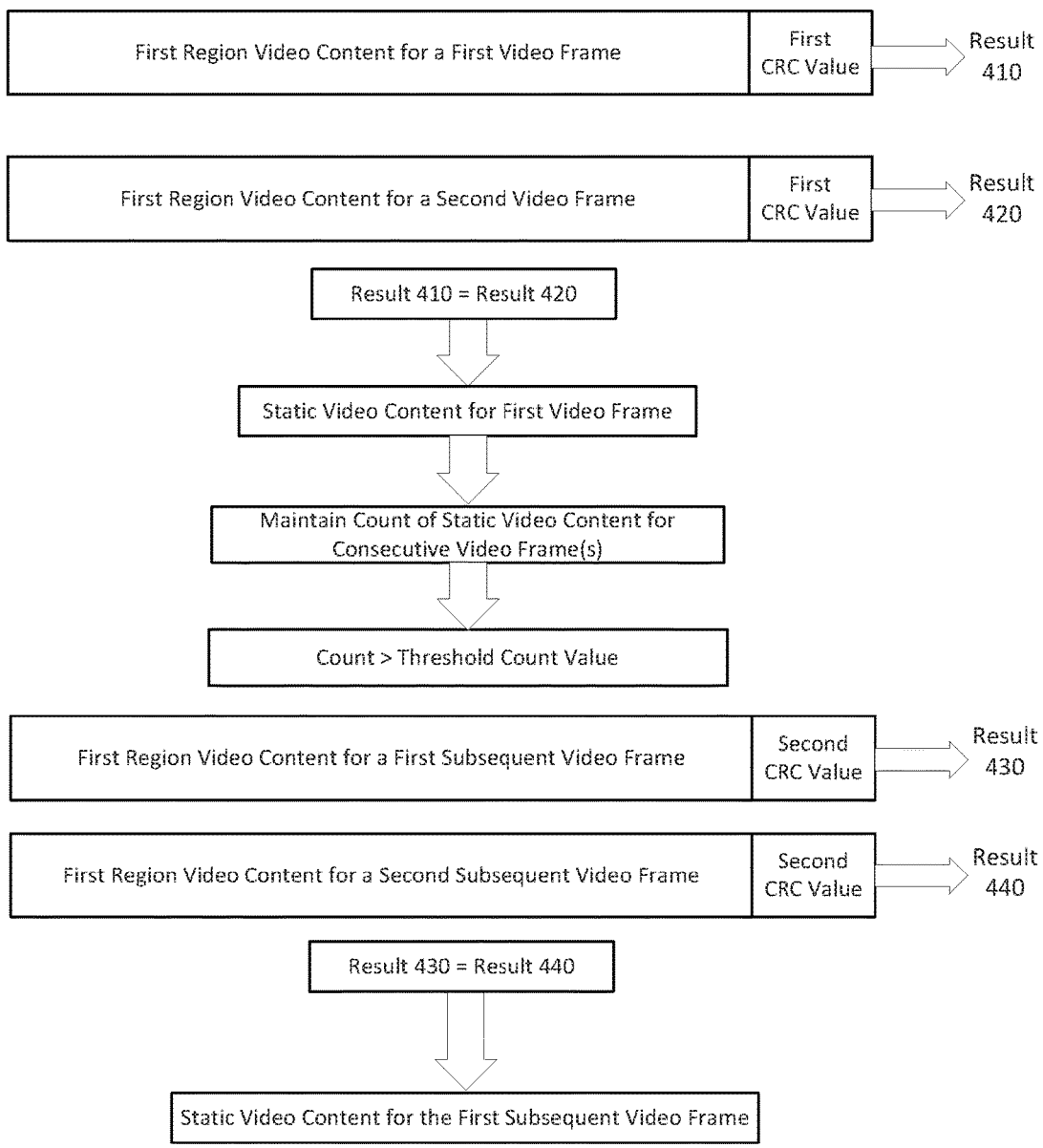
FIG. 4 illustrates an example third characterization scheme.

FIGS. 2-4 illustrates example first, second and third characterization schemes. According to some examples, these characterizations schemes may be implemented by logic and/or features located at or with a device such as device 110 capable of wirelessly docking via a wireless communication link such as wireless communication link 115 to a device such as device 120 having a display such as display 122. For these examples, video content to be presented in a first region of the display such as region 122-1 may be received by the logic and/or features of device 110 such as modules to be executed by circuitry 112-2 of chipset 112.

In some examples, video content to be presented at region 122-1 of display 122 may be transmitted from device 110 with a series of consecutive video frames that refresh or update video content to be presented at display 122. Thus, for these examples, at least the first consecutive video frame may include video content destined for region 122-1. Depending on whether the video content for the first and subsequently consecutive video frames is characterized as static video content, subsequent consecutive video frames (e.g., second, third, fourth, etc.) may or may not include video content destined for region 122-1.

As shown in FIG. 2, the first characterization scheme includes characterization scheme 200. According to some examples, first region video content may represent video content destined for presentation at region 122-1 of display 120. For these examples, a same CRC value may be added to a first region video content for a first video frame and to a first region video content for a second video frame. As shown in FIG. 2, respective results 210 and 220 may be generated. Results 210 and 220 may be first and second results of a CRC function executed by multiplying the same CRC value by separate values representing the first region video content for the first video frame and the first region video content for the second video frame.

In some examples, as shown in FIG. 2, result 210 may equal or match result 220. For these examples, the matching results may characterize the first region video content as static video content for the first and second consecutive video frames. According to some examples, characterization scheme 200 as shown in FIG. 2 may then cause a different CRC value to be added to first region video content for the second video frame and to first region video content for a third video frame. As shown in FIG. 2, respective results 230 and 240 may be generated. Results 230 and 240 may be third and fourth results of the CRC function executed by multiplying the different CRC value by separate values representing the first region video content for the second video frame and the first region video content for the third video frame.

According to some examples, as shown in FIG. 2, result 230 may equal or match result 240. For these examples, the matching results may further characterize the video content as static video content for the first, second and third video frames. Use of the different CRC value for comparing results 230 and 240 may reduce the probability of a mischaracterization. For example, if a mischaracterization was made via the comparison of results 210 and 220, then changing the CRC value for results 230 and 240 would likely show unequal or non-matching results. As a result, the mischaracterization may be for no more than one or two video frames. As mentioned previously, video frames may be transmitted at a rate of 30 or 60 frames per second so the mischaracterization may occur for $\frac{1}{15}^{th}$ or $\frac{1}{30}^{th}$ of a second. Either of these times would likely be undetectable to a human observer of the video content.

As shown in FIG. 3, the second characterization scheme includes characterization scheme 300. According to some examples, a first CRC value may be added to a first region video content for a first video frame and to a first region video content for a second video frame. As shown in FIG. 3, respective results 310 and 320 may be generated. Results 310 and 320 may be first and second results of a CRC function executed by multiplying the first CRC value by separate values representing the first region video content for the first video frame and the first region video content for the second video frame.

In some examples, as shown in FIG. 3, a second CRC value may be added to a first region video content for a first video frame and to a first region video content for a second video frame. As shown in FIG. 3, respective results 330 and 340 may be generated. Results 330 and 340 may be third and fourth results of a CRC function executed by multiplying the second CRC value by separate values representing the first region video content for the first video frame and the first region video content for the second video frame.

According to some examples, if result 310 matches result 320 and result 330 matches result 340, the first region video content may be characterized as static video content for the first and second video frames. For these examples, use of multiple CRC values resulting in the two comparisons reduces the likelihood of a mischaracterization of the first region video content and thus may improve user experience by improving consistency between first region video content and video content presented in other regions. In some examples, CRC functions may be executed and comparisons may be made in parallel. For example, circuitry 112-1 of chipset 112 may be capable of executing multiple parallel threads to enable the comparison of result 310 to result 320 and result 330 to result 340 to characterize the first region video content for the first and second video frames using two CRC values.

This disclosure is not limited to first and second CRC values, any number of CRC values may be contemplated and any number of comparisons may be made to characterize video content for video frames to be transmitted to a wirelessly docked device having a display.

As shown in FIG. 4, the third characterization scheme includes characterization scheme 400. According to some examples, a first CRC value may be added to a first region video content for a first video frame and to a first region video content for a second video frame. As shown in FIG. 4, respective results 410 and 420 may be generated. Results 410 and 420 may be first and second results of a CRC function executed by multiplying the first CRC value by separate values representing the first region video content for the first video frame and the first region video content for the second video frame.

In some examples, a count may be maintained of consecutive video frames for the first region video content characterized as static video content. For these examples, result pairs of the CRC function using the first CRC value may result in the characterization as static video content. As shown in FIG. 4, once the count is greater than a threshold count value a second CRC value may be added to a first region video content for a first subsequent video frame and to a first region video content for a second subsequent video frame. As shown in FIG. 4, respective results 430 and 440 may be generated. Results 430 and 440 may be third and fourth results of a CRC function executed by multiplying the second CRC value by separate values representing the first region video content for the first subsequent video frame and the first region video content for the second subsequent video frame.

According to some examples, using the second CRC value after the count exceeds the threshold count value may mitigate mischaracterization to the number of frames up to the threshold count value. For example, for a frame rate of 30 frames a second. A threshold count value of 30 would result in only 1 second of possibly mischaracterized video content. A human observer may only briefly observe this mischaracterization.

In some examples, using the second CRC value after the count exceeds the threshold count value may also place less of a computational burden on the transmitting device by not having to switch CRC values and implement multiple comparisons after each consecutive video frame. Also, if the first region video content is consistently non-static, the count may rarely reach the threshold count value and multiple comparisons may be substantially reduced for this type of first region video content.

Figure 5:
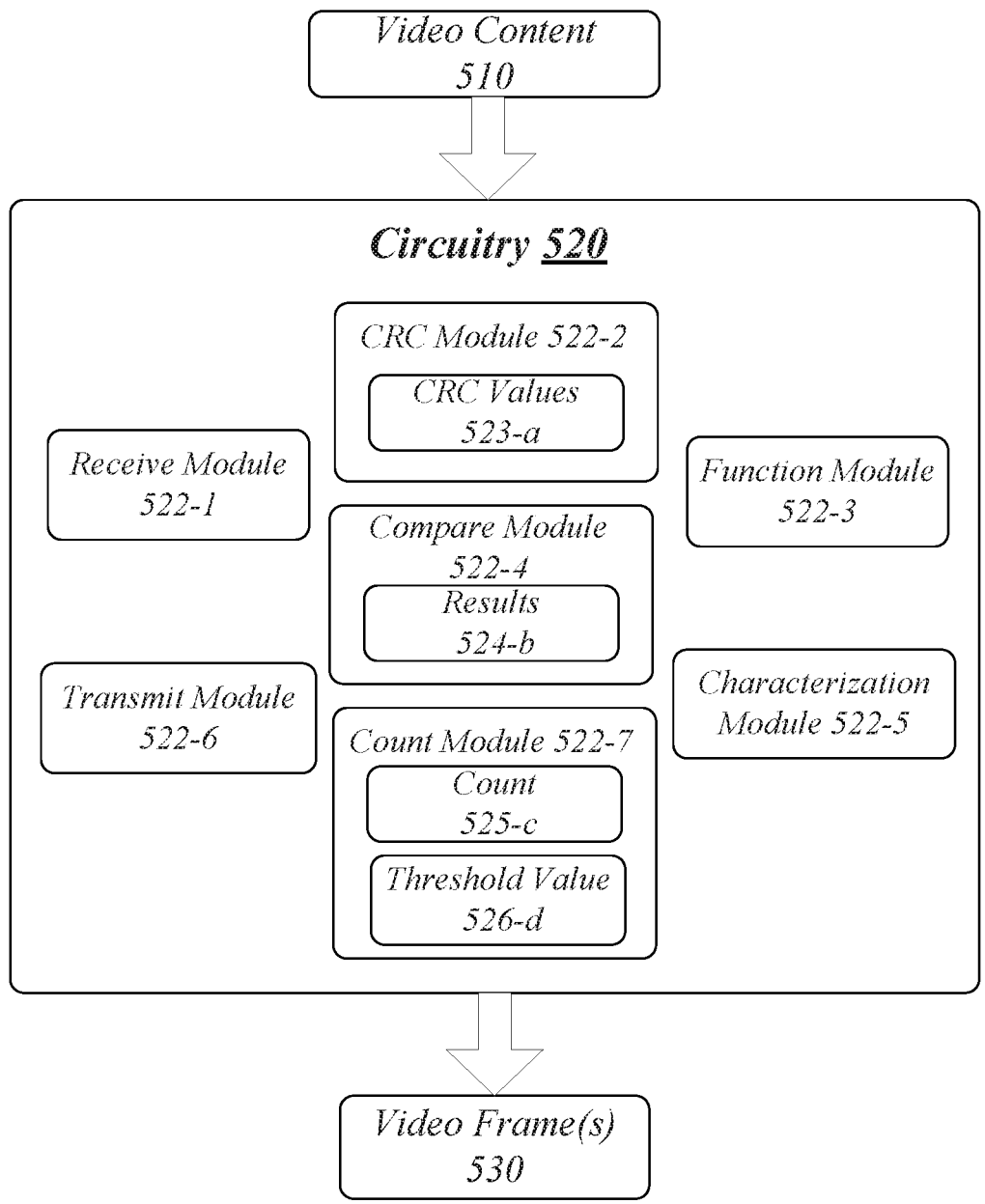
FIG. 5 illustrates an example block diagram for an apparatus.

FIG. 5 illustrates a block diagram for an apparatus 500. Although apparatus 500 shown in FIG. 5 has a limited number of elements in a certain topology or configuration, it may be appreciated that apparatus 500 may include more or less elements in alternate configurations as desired for a given implementation.

The apparatus 500 may have circuitry 520 arranged to execute one or more modules or components 522-$a$. It is worthy to note that "a" and "b" and "c" and similar designators as used herein are intended to be variables representing any positive integer. Thus, for example, if an implementation sets a value for a=7, then a complete set of modules 522-$a$ may include modules 522-1, 522-2, 522-3, 522-4, 522-5, 522-6 and 522-7. The embodiments are not limited in this context.

According to some examples, apparatus 500 may be part of a device (e.g., located at or with a chipset) capable of operating in compliance with one or more wireless technologies such as those described in or associated with the IEEE 802.11 standards. For example, apparatus 500 may be capable of communicatively coupling or wirelessly docking to another device having a display via a wireless communication link or channel established and/or operated according to IEEE 802.1 lad and/or WiGig. The examples are not limited in this context.

In some examples, as shown in FIG. 5, apparatus 500 includes circuitry 520. Circuitry 520 may be generally arranged to execute one or more modules 522-$a$. Circuitry 520 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Qualcomm® Snapdragon®; Intel® Celeron®, Core (2) Duo®, Core i3, Core i5, Core i7, Itanium®, Pentium®, Xeon®, Atom® and XScale® processors; and similar processors. Other types of multi-core processors and other multi-processor architectures may also be employed as circuitry 520. According to some examples circuitry 520 may also be an application specific integrated circuit (ASIC) or a field programmable gate array (FPGA) and modules 522-$a$ may be implemented as hardware elements of the ASIC or the FPGA.

According to some examples, apparatus 500 may include a receive module 522-1. Receive module 522-1 may be executed by circuitry 520 to receive video content to be presented in a first region of another device's display via which a device having apparatus 500 may be wirelessly docked. For these examples, receive module 522-1 may receive video content 510 that is destined for the first region of the display. In some examples, video content 510 may be received from a frame buffer maintained at the device (e.g., at or with a chipset).

In some examples, apparatus 500 may also include a CRC module 522-2. CRC module 522-2 may be executed by circuitry 520 to add a first and a second CRC value to the video content. For these examples, the first and the second CRC value may be maintained as CRC values 523-$a$ in a memory structure such as registers or in a data structure such as a look up table (LUT). The registers or LUT having CRC values 523-$a$ may be accessible to and/or maintained by CRC module 522-2.

In some examples, apparatus 500 may also include a function module 522-3. Function module 522-3 may be executed by circuitry 520 to generate first and second results of a CRC function for respective consecutive first and second video frames for the video content using the first CRC value and generate third and fourth results of the CRC function for respective third and fourth video frames of the video content using the second CRC value According to some examples, apparatus 500 may also include a compare module 522-4. Compare module 522-4 may be executed by circuitry 520 to compare the first and second results and the third and fourth results. For these examples, the first, second, third and fourth results may be at least temporarily maintained as results 524-$a$ in memory structure such as a LUT. The LUT having results 524-$a$ may be accessible and/or maintained by compare module 522-4

In some examples, apparatus 500 may also include a characterization module 522-5. Characterization module 522-5 may be executed by circuitry 520 to characterize the video content as static video content for the first and second video frames based on the first and second results matching and the third and fourth results matching. For these examples, compare module 522-4 may indicate the matching based on the comparisons of the pairs of results.

In some examples, apparatus 500 may also include a transmit module 522-6. Transmit module 522-6 may be executed by circuitry 520 to cause the video content for the first video frame to be transmitted to the other device having the display and may also cause the video content for the second video frame to not be transmitted to the other device having the display. For these examples, video frame(s) 530 would only include first region video content for the first frame.

In some examples, apparatus 500 may also include a count module 522-7. Count module 522-7 may be executed by circuitry 520 to maintain a count of consecutive video frames for the first region video content characterized as static video content. Count module 522-7 may increment the count following transmission of each video frame for first region video content characterized as static video content. Count module 522-7 may compare the count to a threshold count value and may cause the first region video content characterized as static video content to be transmitted to the other device with a given consecutive video frame based on the count exceeding the threshold count value. The threshold count value may be represented by "M" consecutive video frames, where M is greater than 2. The given consecutive video frame may correspond to a consecutive video frame that caused the count to exceed the threshold count value. For these examples, count module 522-7 may maintain the count as count 525-$c$ and the threshold count value as threshold value 526-$d$ (e.g., in a LUT). Transmit module 522-6 may then transmit the given consecutive video frame with video frame(s) 530 to the other device for presentation of the first region video content. As mentioned previously, transmitting first region video content characterized as static video content may mitigate the effects of possible mischaracterization.

In some other examples, based on the count exceeding the threshold count value, CRC module 522-2 may add a second CRC value (e.g., obtained from CRC values 523-a) to the video content. For these examples, compare module 522-4 may then compare third and fourth results of the CRC function executed by function module 522-3 for respective first and second subsequent video frames for the video content following the count exceeding the threshold count value. Characterization module 522-5 may then characterize the video content for the first and second subsequent video frames as static video content based on the third and fourth results matching.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 6:
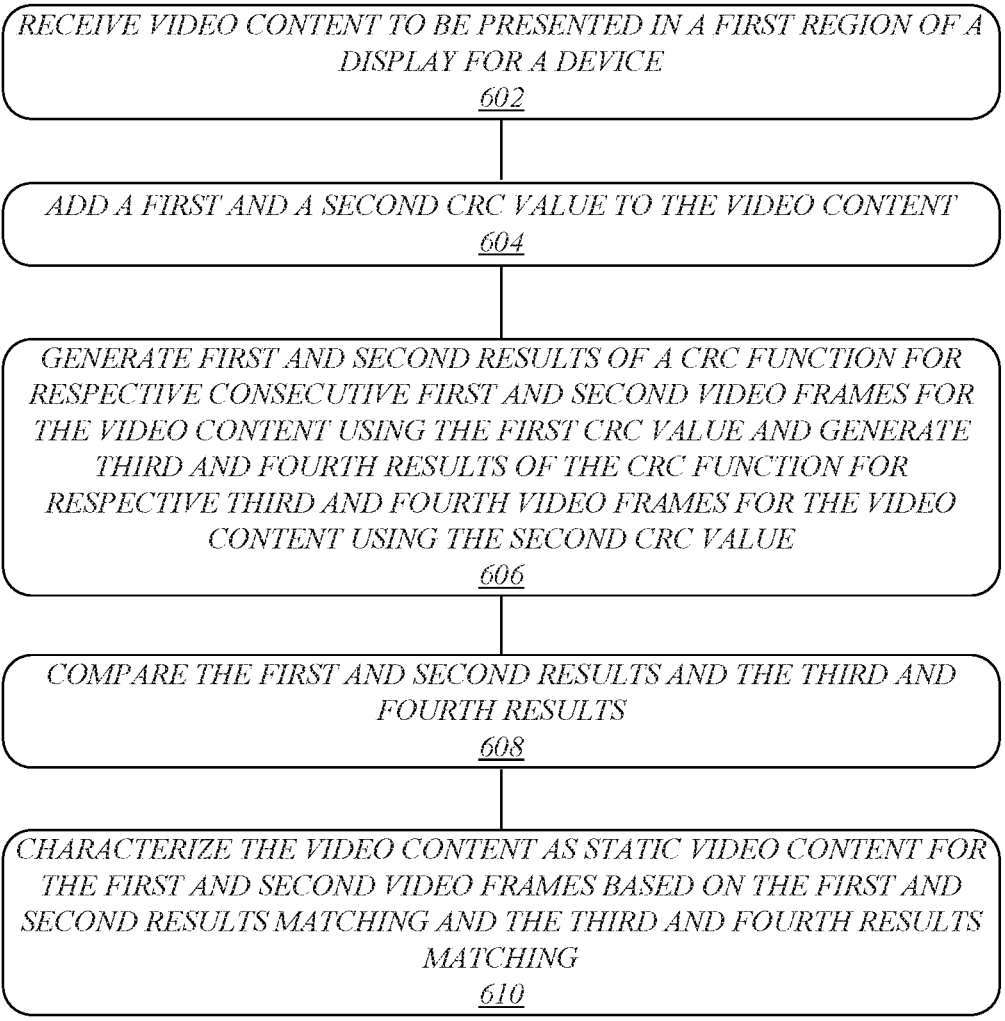
FIG. 6 illustrates an example of a first logic flow.

FIG. 6 illustrates an example of a first logic flow. As shown in FIG. 6, the first logic flow includes a logic flow 600. Logic flow 600 may be representative of some or all of the operations executed by one or more logic, features, or devices described herein, such as apparatus 500. More particularly, logic flow 600 may be implemented by receive module 522-1, CRC module 522-2, function module 522-3, compare module 522-4, characterization module 522-5, transmit module 522-6 or count module 522-7.

In the illustrated example shown in FIG. 6, logic flow 600 may receive video content to be presented in a first region of a display for a device at block 602. For these examples, video content 510 may be received by receive module 522-1.

According to some examples, logic flow 600 at block 604 may add a first and a second CRC value to the video content. For these examples, CRC module 522-1 may add the first and second CRC values to video content 510 in a similar manner as described above for characterization scheme 300.

In some examples, logic flow 600 at block 606 may generate first and second results of a CRC function for respective consecutive first and second video frames of the video content using the first CRC value. Also, logic flow at block 606 may generate third and fourth results of the CRC function for respective third and fourth video frames of the video content using the second CRC value. For these examples, function module 522-3 may generate these four results.

According to some examples, logic flow 600 at block 608 may compare the first and second results and the third and fourth results. For these examples, compare module 522-4 may conduct the comparison of the results.

In some examples, logic flow at block 610 may characterize the video content as static video content for the first and second video frames based on the first and second results matching and the third and fourth results matching. For these examples, characterization module 522-5 may characterize the video content based on the matching results. The matching results may be indicated to characterization module 522-5 by compare module 522-4.

According to some examples, transmit module 522-6 may cause just the video content for the first video frame to be transmitted to the device having the display in video frame(s) 530.

FIG. 7 illustrates an example of a second logic flow. As shown in FIG. 7, the second logic flow includes a logic flow 700. Logic flow 700 may be representative of some or all of the operations executed by one or more logic, features, or devices described herein, such as apparatus 500. More particularly, logic flow 700 may be implemented by receive module 522-1, CRC module 522-2, function module 522-3, compare module 522-4, characterization module 522-5, transmit module 522-6 or count module 522-7.

In the illustrated example shown in FIG. 7, logic flow 700 may receive video content to be presented in a first region of a display for a device at block 702. For these examples, video content 510 may be received by receive module 522-1.

According to some examples, logic flow 700 at block 704 may add a CRC value to the video content. For these examples, CRC module 522-1 may add the CRC value to video content 510 in a similar manner as described above for characterization scheme 200.

In some examples, logic flow 700 at block 706 may compare first and second results of a CRC function executed for respective consecutive first and second video frames for the video content. For these examples, compare module 522-4 may conduct the comparison of the first and second results of the CRC function executed by function module 522-3 using the added CRC value.

In some examples, logic flow 700 at block 710 may characterize the video content as static video content for the first and second video frames based on the first and second results matching. For these examples, characterization module 522-5 may characterize the video content based on the matching results. The matching results may be indicated to characterization module 522-5 by compare module 522-4.

According to some examples, logic flow 700 at block 710 may determine whether a consecutive third video frame for the video content is also characterized as static video content. As part of that determination, logic flow 700 at block 712 may add a different CRC value to the video content. Logic flow 700 at block 714 may then compare third and fourth results of the CRC function executed for respective second and third video frames for the video content. Logic flow 700 at block 716 may then characterize the video content for the third video frame as static video content based on the third and fourth results matching. For these examples, block 712 may be implemented by CRC module 522-2 adding the different CRC value. Block 714 may be implemented by compare module 522-4 conducting the comparison of the third and fourth results of the CRC function executed by function module 522-3 using the added different CRC value. Block 716 may be implemented by characterization module 522-5 based on matching third and fourth results indicated to characterization module 522-5 by compare module 522-4.

According to some examples, transmit module 522-6 may cause just the video content for the first video frame to be transmitted to the device having the display in video frame(s) 530. For these examples, the video content destined for the first region of the display may be withheld from being transmitted to the device for the second and third video frames.

FIG. 8 illustrates an example of a third logic flow. As shown in FIG. 8, the third logic flow includes a logic flow 800. Logic flow 800 may be representative of some or all of the operations executed by one or more logic, features, or devices described herein, such as apparatus 500. More particularly, logic flow 800 may be implemented by receive module 522-1, CRC module 522-2, function module 522-3, compare module 522-4, characterization module 522-5, transmit module 522-6 or count module 522-7.

In the illustrated example shown in FIG. 8, logic flow 800 may receive video content to be presented in a first region of a display for a device at block 802. For these examples, video content 510 may be received by receive module 522-1.

According to some examples, logic flow 800 at block 804 may add a CRC value to the video content. For these examples, CRC module 522-1 may add the CRC value to video content 510 in a similar manner as described above for characterization scheme 400.

In some examples, logic flow 800 at block 806 may compare first and second results of a CRC function executed for respective consecutive first and second video frames for the video content. For these examples, compare module 522-4 may conduct the comparison of the first and second results of the CRC function executed by function module 522-3 using the added CRC value.

In some examples, logic flow 800 at block 810 may characterize the video content as static video content for the first and second video frames based on the first and second results matching. For these examples, characterization module 522-5 may characterize the video content based on the matching results. The matching results may be indicated to characterization module 522-5 by compare module 522-4.

According to some examples, logic flow 800 at block 810 may characterize video content for consecutive video frames following the first video frame. As part of that characterization, logic flow 800 at block 812 may maintain a count of consecutive video frames for the video content characterized as static video content. Logic flow 800 at block 814 may compare the count to a threshold count value. Logic flow 800 at block 816 may then add a second CRC value to the video content based on the count exceeding the threshold value. Logic flow 800 at block 818 may then compare third and further results of the CRC function executed for respective first and second subsequent video frames for the video content following the count exceeding the threshold count value. Logic flow 800 at block 820 may then characterize the video content for the first and second subsequent video frames as static video content based on the third and fourth results matching. For these examples, blocks 812 and 814 may be implemented by count module 522-7 maintaining the count and making the comparison to the threshold count value. Block 816 may be implemented by CRC module 522-2 adding the second CRC value. Block 818 may be implemented by compare module 522-4 conducting the comparison of the third and fourth results of the CRC function executed by function module 522-3 using the added second CRC value. Block 820 may be implemented by characterization module 522-5 based on matching third and fourth results indicated to characterization module 522-5 by compare module 522-4.

According to some examples, transmit module 522-6 may cause the video content destined for the first region of the display to be withheld from being transmitted to the device for the second and third subsequent video frames.

Figure 9:
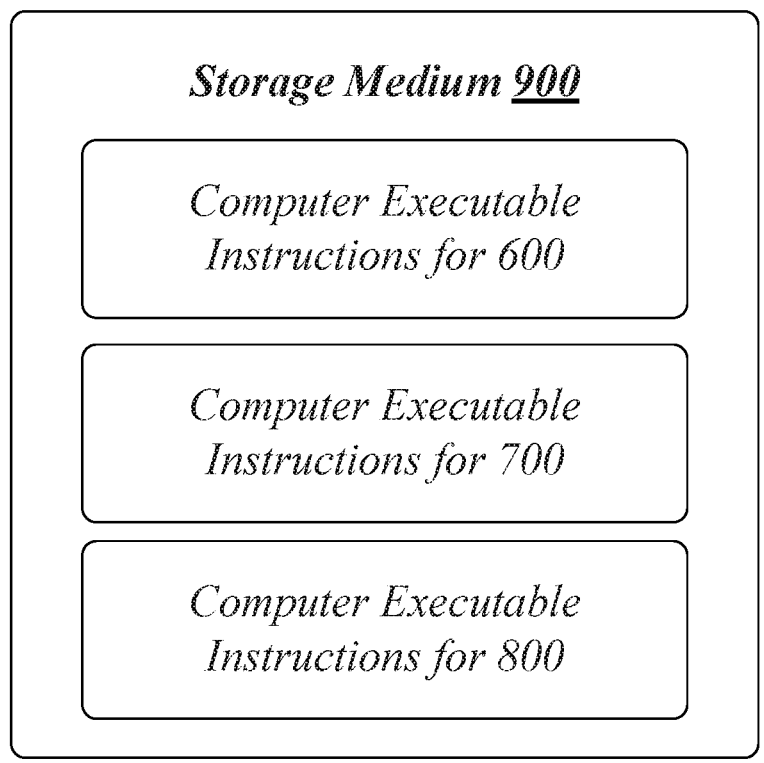
FIG. 9 illustrates an example of a storage medium.

FIG. 9 illustrates an embodiment of a first storage medium. As shown in FIG. 9, the first storage medium includes a storage medium 900. Storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 600, 700 or 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
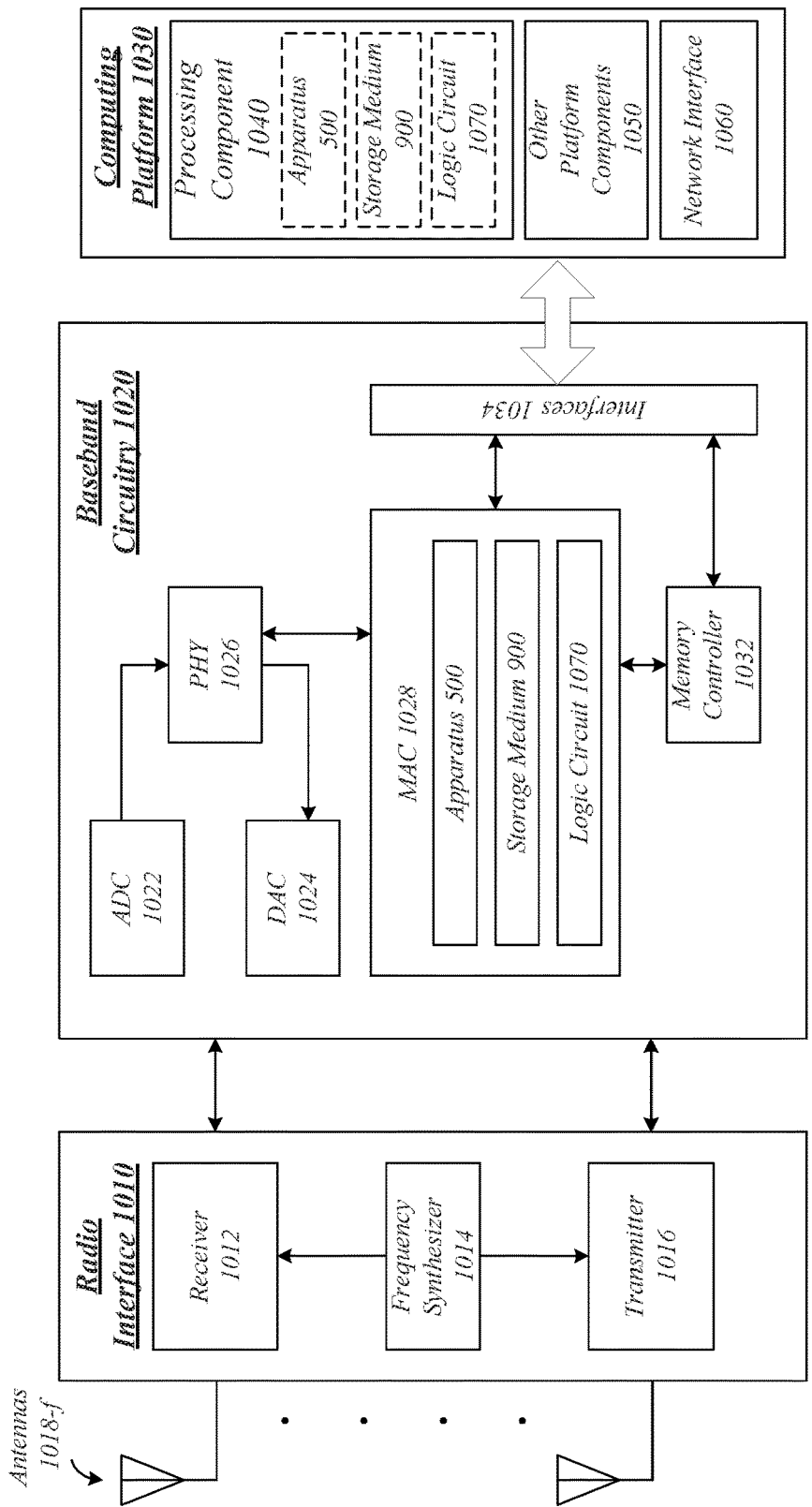
FIG. 10 illustrates an example of a device.

FIG. 10 illustrates an embodiment of a device 1000. In some examples, device 1000 may be configured or arranged for wireless communications to wirelessly dock to one or more other devices having a display to display or present video content. Device 1000 may implement, for example, apparatus 500, storage medium 900 and/or a logic circuit 1070. The logic circuit 1070 may include physical circuits to perform operations described for apparatus 500. As shown in FIG. 10, device 1000 may include a radio interface 1010, baseband circuitry 1020, and computing platform 1030, although examples are not limited to this configuration.

The device 1000 may implement some or all of the structure and/or operations for apparatus 500, storage medium 900 and/or logic circuit 1070 in a single computing entity, such as entirely within a single device. The embodiments are not limited in this context.

In one example, radio interface 1010 may include a component or combination of components adapted for transmitting and/or receiving single carrier or multi-carrier modulated signals (e.g., including complementary code keying (CCK) and/or orthogonal frequency division multiplexing (OFDM) symbols and/or single carrier frequency division multiplexing (SC-FDM symbols) although the embodiments are not limited to any specific over-the-air interface or modulation scheme. Radio interface 1010 may include, for example, a receiver 1012, a transmitter 1016 and/or a frequency synthesizer 1014. Radio interface 1010 may include bias controls, a crystal oscillator and/or one or more antennas 1018-$f$. In another embodiment, radio interface 1010 may use external voltage-controlled oscillators (VCOs), surface acoustic wave filters, intermediate frequency (IF) filters and/or RF filters, as desired. Due to the variety of potential RF interface designs an expansive description thereof is omitted.

Baseband circuitry 1020 may communicate with radio interface 1010 to process receive and/or transmit signals and may include, for example, an analog-to-digital converter 1022 for down converting received signals, a digital-to-analog converter 1024 for up converting signals for transmission. Further, baseband circuitry 1020 may include a baseband or physical layer (PHY) processing circuit 1026 for PHY link layer processing of respective receive/transmit signals. Baseband circuitry 1020 may include, for example, a processing circuit 1028 for medium access control (MAC)/data link layer processing. Baseband circuitry 1020 may include a memory controller 1032 for communicating with MAC processing circuit 1028 and/or a computing platform 1030, for example, via one or more interfaces 1034.

In some embodiments, PHY processing circuit 1026 may include a frame construction and/or detection module, in combination with additional circuitry such as a buffer memory, to construct and/or deconstruct communication frames (e.g., containing subframes). Alternatively or in addition, MAC processing circuit 1028 may share processing for certain of these functions or perform these processes independent of PHY processing circuit 1026. In some embodiments, MAC and PHY processing may be integrated into a single circuit.

Computing platform 1030 may provide computing functionality for device 1000. As shown, computing platform 1030 may include a processing component 1040. In addition to, or alternatively of, baseband circuitry 1020 of device 1000 may execute processing operations or logic for apparatus 500, storage medium 900, and logic circuit 1070 using the processing component 1030. Processing component 1040 (and/or PHY 1026 and/or MAC 1028) may comprise various hardware elements, software elements, or a combination of both. Examples of hardware elements may include devices, logic devices, components, processors, microprocessors, circuits, processor circuits (e.g., processor circuit 1020), circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

Computing platform 1030 may further include other platform components 1050. Other platform components 1050 include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information.

Computing platform 1030 may further include a network interface 1060. In some examples, network interface 1060 may include logic and/or features to support network interfaces operated in compliance with one or more wireless broadband technologies such as those described in one or more standards associated with IEEE 802.11 and/or WiGig.

Device 1000 may be, for example, user equipment, a computer, a personal computer (PC), a desktop computer, a laptop computer, an ultrabook computer, a smartphone, a tablet computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of device 1000 described herein, may be included or omitted in various embodiments of device 1000, as suitably desired. In some embodiments, device 1000 may be configured to be compatible with protocols and frequencies associated with IEEE 802.11 Standards for WLANs and/or wireless docking technologies or standards such as WiGig, although the examples are not limited in this respect.

Embodiments of device 1000 may be implemented using single input single output (SISO) architectures. However, certain implementations may include multiple antennas (e.g., antennas 1018-*f*) for transmission and/or reception using adaptive antenna techniques for beamforming or spatial division multiple access (SDMA) and/or using multiple input multiple output (MIMO) communication techniques.

The components and features of device 1000 may be implemented using any combination of discrete circuitry, ASICs, logic gates and/or single chip architectures. Further, the features of device 1000 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary device 1000 shown in the block diagram of FIG. 10 may represent one functionally descriptive example of many potential implementations. Accordingly, division, omission or inclusion of block functions depicted in the accompanying figures does not infer that the hardware components, circuits, software and/or elements for implementing these functions would be necessarily be divided, omitted, or included in embodiments.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled", "connected", or "capable of being coupled" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

According to some examples, an example first apparatus for a device may include circuitry. For these examples, a receive module may be executed by the circuitry to receive video content to be presented in a first region of a display. A CRC module may also be executed by the circuitry to add a first and a second CRC value to the video content. A function module may also be executed by the circuitry to generate first and second results of a CRC function for respective consecutive first and second video frames for the video content using the first CRC value and generate third and fourth results of the CRC function for respective third and fourth video frames for the video content using the second CRC value. A compare module may also be executed by the circuitry to compare the first and second results and the third and fourth results. A characterization module may also be executed by the circuitry to characterize the video content as static video content for the first and second video frames based on the first and second results matching and the third and fourth results matching.

In some examples for the example first apparatus, a transmit module may also be executed by the circuitry to cause the video content for the first video frame to be presented in the first region to be transmitted by an RF transceiver and to cause the video content for the second video frame to be presented to not be transmitted by the RF transceiver.

According to some examples for the example first apparatus, a count module may also be executed by the circuitry to maintain a count of consecutive video frames for the video content characterized as static video content. The count module may also compare the count to a threshold count value and cause the video content characterized as static video content to be presented with a given consecutive video frame based on the count exceeding the threshold count value. The given consecutive video frame may correspond to a consecutive video frame that caused the count to exceed the threshold count value.

In some examples for the example first apparatus, the CRC function may include the function module to generate a result of the CRC function by multiplying a given CRC value with a value representing video content to be presented in the first region of the display for a given video frame. For these examples, a product of the multiplication may provide the result of the CRC function.

According to some examples for the example first apparatus, the circuitry may be maintained with a chipset for the device. The chipset may enable the device to wirelessly dock to another device having the display.

In some examples for the example first apparatus, the chipset may operate in compliance with at least one or more wireless communication standards associated with the IEEE 802.11 standards to include IEEE 802.11ad. For these examples, the chipset may be capable of supporting a WiGig Display Extension (WDE) to enable the video content to be transmitted to the display via the wireless dock.

According to some examples for the example first apparatus, the receive module may receive the video content from a frame buffer maintained at the chipset. For these examples, the frame buffer may include one of a volatile memory or a non-volatile memory.

In some examples, example first methods implemented at a device may include receiving video content to be presented in a first region of a display. The example first method may also include adding a cyclic redundancy check (CRC) value to the video content and comparing first and second results of a CRC function executed for respective consecutive first and second video frames for the video content. The example first method may also include characterizing the video content as static video content for the first and second video frames based on the first and second results matching. The example first method may also include determining whether a consecutive third video frame for the video content is also characterized as static video content by adding a different CRC value to the video content, comparing third and fourth results of the CRC function executed for respective second and third video frames of the video content, and characterizing the video content for the third video frame as static video content based on the third and fourth results matching.

In some examples, the example first methods may also include causing the video content for the first video frame to be presented in the first region to be transmitted for presenting. The example first methods may also include withholding transmission of the video content for the second video frame to be presented in the first region and withholding transmission of the third video frame to be presented in the first region based on a characterization of the video content for the third video frame as static video.

According to some examples, characterizing the video content as static video for the first and second video frames may also include adding at least one additional CRC value to the video content, comparing fifth and sixth results of the CRC function for respective first and second video frames, and characterizing the video content for the first and second video frames as static video content based on the fifth and sixth results also matching.

In some examples, the example first methods may include comparing the fifth and sixth results in parallel with comparing the first and second results to characterize the video content for the first and second video frames as static video content.

According to some examples, the example first methods may also include maintaining a count of consecutive video frames for the video content characterized as static video content. The example first methods may also include comparing the count to a threshold count value and causing the video content characterized as static video content to be transmitted with a given consecutive video frame based on the count exceeding the threshold count value. For these examples, the count may be reset following transmission of the given consecutive video frame for the video content still characterized as static video.

In some examples, the example first methods may include the threshold count value represented by "M" consecutive video frames, where M is greater than 2.

According to some examples for the example first methods, the CRC function executed for respective consecutive first and second video frames may include multiplying the CRC value with separate values representing video content to be presented in the first region for the respective consecutive first and second video frames. A first product of the multiplication for the video content for the first video frame may be the first result of the CRC function. A second product of the multiplication for the video content for the second video frame may be the second result of the CRC function.

In some examples for the example first methods, the video content may be presented in the first region of the display at a video frame rate of 30 or 60 video frames per second.

According to some examples for the example first methods, the device may be configured to operate in compliance with at least one or more wireless communication standards associated with the IEEE 802.11 standards to include IEEE 802.11ad. The device may include a chipset capable of supporting a WiGig Display Extension (WDE) to enable the video content to be transmitted to a device having the display.

According to some examples, at least one machine readable medium comprising a plurality of instructions that in response to being executed on a computing device cause the computing device to carry out the example first methods as mentioned above.

In some examples, a second apparatus may comprise means for performing the first methods as mentioned above.

According to some examples, an example at least one machine readable medium may include a plurality of instructions that in response to being executed on a system maintained at a device cause the system to receive video content to be presented in a first region of a display and add a first CRC value to the video content. The instructions may also cause the system to compare first and second results of a CRC function executed for respective consecutive first and second video frames for the video content and characterize the video content as static video for at least the first and second video frames based on a the first and second results matching. The instructions may also cause the system to characterize video content for the consecutive video frames following the first video frame based on the instructions causing the system to maintain a count of the consecutive video frames for the video content characterized as static video content, compare the count to a threshold count value, add a second CRC value to the video content based on the count exceeding the threshold count value, compare third and fourth results of the CRC function executed for respective first and second subsequent video frames for the video content following the count exceeding the threshold count value. The instructions may then cause the system to characterize the video content for the first and second subsequent video frames as static video content based on the third and fourth results matching.

In some examples for the at least one machine readable medium, the instructions may also cause the system to cause the video content for the first video frame to be presented in the first region to be transmitted for presenting. The instructions may also cause the system to withhold transmission of the video content for the second video frame to be presented in the first region. The instructions may also cause the system to withhold transmission of the video content for the first and second subsequent video frames to be displayed in the first region based on a characterization of the video content for the first and second subsequent video frames as static video content.

In some examples for the at least one machine readable medium, the instructions to also cause the system to add at least a third CRC value to the video content for the first and second video frames to be presented in the first region and compare fifth and sixth results of the CRC function for respective first and second video frames for the video content. The instructions may also cause the system to characterize the video content for the first and second video frames as static video content based on the fifth and sixth results also matching.

According to some examples for the at least one machine readable medium, the instructions may also cause the system to maintain a count of consecutive video frames for the video content characterized as static video content and compare the count to a threshold count value. The instructions may also cause the system to cause the video content characterized as static video content to be transmitted for presenting in the first region based on the count exceeding the threshold count value.

In some examples for the at least one machine readable medium, the device may be configured to operate in compliance with at least one or more wireless communication standards associated with the IEEE 802.11 standards to include IEEE 802.11ad. For these examples, the device may include a chipset capable of supporting a WiGig Display Extension (WDE) to enable the video content to be transmitted to another device having the display.

According to some examples, an example third apparatus for a device may include means for receiving video content to be presented in a first region of a display and means for adding a first and a second CRC value to the video content. The example third apparatus may also include means for generating first and second results of a CRC function for respective consecutive first and second video frames for the video content using the first CRC value and means for generating third and fourth results of the CRC function for respective third and fourth video frames for the video content using the second CRC value. The example third apparatus may also include means for comparing the first and second results and the third and fourth results and means for characterizing the video content as static video content for the first and second video frames based on the first and second results matching and the third and fourth results matching.

In some examples, the example third apparatus may also include means for causing the video content for the first video frame to be presented in the first region and for causing the video content for the second video frame to not be presented in the first region.

In some examples, the example third apparatus may also include means for maintaining a count of consecutive video frames for the video content characterized as static video content, comparing the count to a threshold count value and causing the video content characterized as static video content to be transmitted with a given consecutive video frame based on the count exceeding the threshold count value. The given consecutive video frame may correspond to a consecutive video frame that caused the count to exceed the threshold count value.

In some examples, the example third apparatus may also include means for generating a result of the CRC function by multiplying a given CRC value with a value representing video content to be presented in the first region of the display for a given video frame. A product of the multiplication may provide the result of the CRC function.

In some examples, the example third apparatus may also include circuitry maintained with a chipset for the device. For these examples, the chipset may enable the device to wirelessly dock to another device having the display.

In some examples for the example third apparatus, the chipset may operate in compliance with at least one or more wireless communication standards associated with the IEEE 802.11 standards to include IEEE 802.11ad. The chipset may be capable of supporting a WiGig Display Extension (WDE) to enable the video content to be transmitted to the display via the wireless dock.

In some examples for the example third apparatus, the means for receiving the video content may include means for receiving the video content from a frame buffer maintained at the chipset. For these examples, the frame buffer may include one of a volatile memory or a non-volatile memory.

According to some examples, an example device may include one or more processors, a memory, a radio or one or more antennas. The example device may also include a receive module to be executed by the one or more processors to receive video content to be wirelessly transmitted by the device to a display of another device. The example device may also include CRC module to be executed by the one or more processors to add a first and a second CRC value to received video content to be presented in a first region of the display. The example device may also include a function module to be executed by the one or more processor to generate first and second results of a CRC function for respective consecutive first and second video frames for the received video content to be presented in the first region using the first CRC value and generate third and fourth results of the CRC function for respective third and fourth video frames for the received video content to be presented in the first region using the second CRC value. The example device may also include a compare module to be executed by the one or more processors to compare the first and second results and the third and fourth results. The example device may also include a characterization module to be executed by the one or more processors to characterize the received video content to be presented in the first region as static video content for the first and second video frames based on the first and second results matching and the third and fourth results matching.

According to some examples, the example device may also include a transmit module to be executed by the one or more processors. The transmit module may cause the received video content for the first video frame to be presented in the first region to be transmitted by a radio and may cause the video content for the second video frame to be presented to not be transmitted by the radio.

In some examples, the example device may also include a count module to be executed by the one or more processors. The count module may maintain a count of consecutive video frames for the received video content to be presented in the first region characterized as static video content. The count module may also compare the count to a threshold count value and cause the received video content to be presented in the first region characterized as static video content to be presented with a given consecutive video frame based on the count exceeding the threshold count value. For these examples, the given consecutive video frame may correspond to a consecutive video frame that caused the count to exceed the threshold count value. According to some examples for the example device, the CRC function may include the function module to generate a result of the CRC function by multiplying a given CRC value with a value representing received video content to be presented in the first region of the display for a given video frame. For these examples, a product of the multiplication may provide the result of the CRC function.

In some examples for the example device, the one or more processors may be maintained with a chipset for the device. The chipset may enable the device to wirelessly dock to the display of the other device.

According to some examples for the example device, the chipset may operate in compliance with at least one or more wireless communication standards associated with the IEEE 802.11 standards to include IEEE 802.11ad. For these examples, the chipset may be capable of supporting a WiGig Display Extension (WDE) to enable the video content to be transmitted to the display via the wireless dock.

In some examples for the example device, the receive module may receive the video content from a frame buffer maintained at the chip set. For these examples, the frame buffer may include one of a volatile memory or a non-volatile memory.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What is claimed is:

1. An apparatus, comprising:
   first circuitry to generate a first cyclic redundancy check (CRC) result for a first frame and generate a second CRC result for a second frame; and
   second circuitry to:
      determine whether the second frame comprises static content based on a comparison of the first and second CRC results; and
      in response to a determination that the second frame comprises static content:
         increment a frame count used to track a number of consecutive frames that comprise the static content;
         compare the incremented frame count to a threshold count value; and
         in response to a determination that the incremented frame count is less than the threshold count value, withhold transmission of the static content during transmission of the second frame.

2. The apparatus of claim 1, the first and second frames to comprise consecutive frames.

3. The apparatus of claim 1, the second circuitry to determine that the second frame comprises static content when the first CRC result matches the second CRC result.

4. The apparatus of claim 1, the second circuitry to determine whether a third frame comprises the static content and, in response to a determination that the third frame comprises the static content, increment the frame count.

5. The apparatus of claim 4, the first circuitry to generate a third CRC result for the third frame, the second circuitry to determine whether the third frame comprises the static content based on the third CRC result.

6. The apparatus of claim 5, the second circuitry to determine that the third frame does not comprise the static content when the third CRC result does not match the first and second CRC results.

7. The apparatus of claim 1, comprising:
   a memory coupled with the first and second circuitry, the first circuitry to store the first CRC result in the memory; and
   a display to present the first frame.

8. The apparatus of claim 7, comprising:
   at least one radio frequency (RF) transceiver; and
   at least one RF antenna.

9. At least one non-transitory computer-readable medium comprising a set of instructions that, in response to being executed on a computing device, cause the computing device to:
generate a first cyclic redundancy check (CRC) result for a first frame;
generate a second CRC result for a second frame;
determine whether the second frame comprises static content based on a comparison of the first and second CRC results; and
in response to a determination that the second frame comprises static content:
increment a frame count used to track a number of consecutive frames that comprise the static content;
compare the incremented frame count to a threshold count value; and
in response to a determination that the incremented frame count is less than the threshold count value, withhold transmission of the static content during transmission of the second frame.

10. The at least one non-transitory computer-readable medium of claim 9, the first and second frames to comprise consecutive frames.

11. The at least one non-transitory computer-readable medium of claim 9, comprising instructions that, in response to being executed on the computing device, cause the computing device to determine that the second frame comprises static content when the first CRC result matches the second CRC result.

12. The at least one non-transitory computer-readable medium of claim 9, comprising instructions that, in response to being executed on the computing device, cause the computing device to:
determine whether a third frame comprises the static content; and
increment the frame count in response to a determination that the third frame comprises the static content.

13. The at least one non-transitory computer-readable medium of claim 12, comprising instructions that, in response to being executed on the computing device, cause the computing device to:
generate a third CRC result for the third frame; and
determine whether the third frame comprises the static content based on the third CRC result.

14. The at least one non-transitory computer-readable medium of claim 13, comprising instructions that, in response to being executed on the computing device, cause the computing device to determine that the third frame does not comprise the static content when the third CRC result does not match the first and second CRC results.

15. The at least one non-transitory computer-readable medium of claim 9, comprising instructions that, in response to being executed on the computing device, cause the computing device to transmit the first frame to a display.

16. A method, comprising:
generating a first cyclic redundancy check (CRC) result for a first frame;
generating a second CRC function for a second frame;
determining, by processing circuitry, whether the second frame comprises static content based on a comparison of the first and second CRC results; and
in response to a determination that the second frame comprises static content:
incrementing a frame count used to track a number of consecutive frames that comprise the static content;
comparing the incremented frame count to a threshold count value; and
in response to a determination that the incremented frame count is less than the threshold count value, withholding transmission of the static content during transmission of the second frame.

17. The method of claim 16, the first and second frames to comprise consecutive frames.

18. The method of claim 16, comprising determining that the second frame comprises static content when the first CRC result matches the second CRC result.

19. The method of claim 16, comprising:
determining whether a third frame comprises the static content; and
incrementing the frame count in response to a determination that the third frame comprises the static content.

20. The method of claim 19, comprising:
generating a third CRC result for the third frame; and
determining whether the third frame comprises the static content based on the third CRC result.

21. The method of claim 20, comprising determining that the third frame does not comprise the static content when the third CRC result does not match the first and second CRC results.

22. The method of claim 16, comprising transmitting the first frame to a display.

23. An apparatus, comprising:
means for generating a first cyclic redundancy check (CRC) result for a first frame;
means for generating a second CRC result for a second frame;
means for determining whether the second frame comprises static content based on a comparison of the first and second CRC results; and
means for, in response to a determination that the second frame comprises static content:
incrementing a frame count used to track a number of consecutive frames that comprise the static content;
comparing the incremented frame count to a threshold count value; and
in response to a determination that the incremented frame count is less than the threshold count value, withholding transmission of the static content during transmission of the second frame.

24. The apparatus of claim 23, the first and second frames to comprise consecutive frames.

25. The apparatus of claim 23, comprising means for determining that the second frame comprises static content when the first CRC result matches the second CRC result.

26. The apparatus of claim 23, comprising:
means for determining whether a third frame comprises the static content; and
means for incrementing the frame count in response to a determination that the third frame comprises the static content.

27. The apparatus of claim 26, comprising:
means for generating a third CRC result for the third frame; and
means for determining whether the third frame comprises the static content based on the third CRC result.

28. The apparatus of claim 27, comprising means for determining that the third frame does not comprise the static content when the third CRC result does not match the first and second CRC results.

29. The apparatus of claim 23, comprising:
a memory to store the first CRC result; and
a display to present the first frame.

30. The apparatus of claim 29, comprising:
at least one radio frequency (RF) transceiver; and
at least one RF antenna.

* * * * *